United States Patent [19]
Goronkin et al.

[11] Patent Number: 5,280,180
[45] Date of Patent: Jan. 18, 1994

[54] INTERCONNECT STRUCTURE FOR COUPLING SEMICONDUCTOR REGIONS AND METHOD FOR MAKING

[75] Inventors: Herbert Goronkin, Tempe; Jun Shen, Phoenix; Saied Tehrani, Scottsdale; Raymond K. Tsui, Phoenix; X. Theodore Zhu, Chandler, all of Ariz.

[73] Assignee: Motorola, Inc., Schaumburg, Ill.

[21] Appl. No.: 932,116

[22] Filed: Aug. 19, 1992

[51] Int. Cl.$^5$ .................... H01L 29/161; H01L 29/205
[52] U.S. Cl. ........................................ 257/14; 257/22; 257/24; 257/183
[58] Field of Search .................. 257/14, 15, 20, 22, 257/24, 27, 192, 774, 781, 12, 183

[56] References Cited

U.S. PATENT DOCUMENTS

| | | | |
|---|---|---|---|
| 4,207,122 | 6/1980 | Goodman | 257/201 |
| 4,806,993 | 2/1989 | Voisin et al. | 257/22 |
| 4,835,578 | 5/1989 | Ohtoshi et al. | 257/194 |
| 5,040,032 | 8/1991 | Kadon | 257/14 |
| 5,119,151 | 6/1992 | Onda | 257/14 |
| 5,126,804 | 6/1992 | Nagai et al. | 257/14 |
| 5,144,580 | 9/1992 | Niu et al. | 257/200 |

OTHER PUBLICATIONS

Takahashi et al., "Lateral Quantum Well Wires Fabricated by Selective Metal organic Chemical Vapor Deposition," App. Phys. Lett., vol. 57, #12-17-Sep. 1990, pp. 1209-1211.

Beresford et al., "Polytype Heterostructures for Electron Tunneling Devices," IEDM-89, pp. 547-550 (1989).

*Primary Examiner*—Rolf Hille
*Assistant Examiner*—Mahshid Saadat
*Attorney, Agent, or Firm*—Joe E. Barbee; Aaron Bernstein

[57] ABSTRACT

A semiconductor device having a lateral interconnect or via formed by quantum well comprising a semiconductor material is provided. The lateral interconnect (17, 18, 19) formed by a quantum well comprising a first semiconductor material composition. A first semiconductor region (11, 12, 13) comprising a second material type is formed adjacent to the lateral interconnect (17, 18, 19). A second semiconductor region (23, 24, 26) comprising the second material type is adjacent to the lateral interconnect (17, 18, 19) so that the lateral interconnect (17, 18, 19) separates the first (11, 12, 13) and second (23, 24, 26) semiconductor regions. The first (17, 18, 19) and second (23, 24, 26) semiconductor regions have a first quantized energy level that is substantially equal. The lateral interconnect (17, 18, 19) has a first quantized energy level capable of alignment with the quantized energy levels of the first (11, 12, 13) and second (23, 24, 26) semiconductor regions.

8 Claims, 2 Drawing Sheets

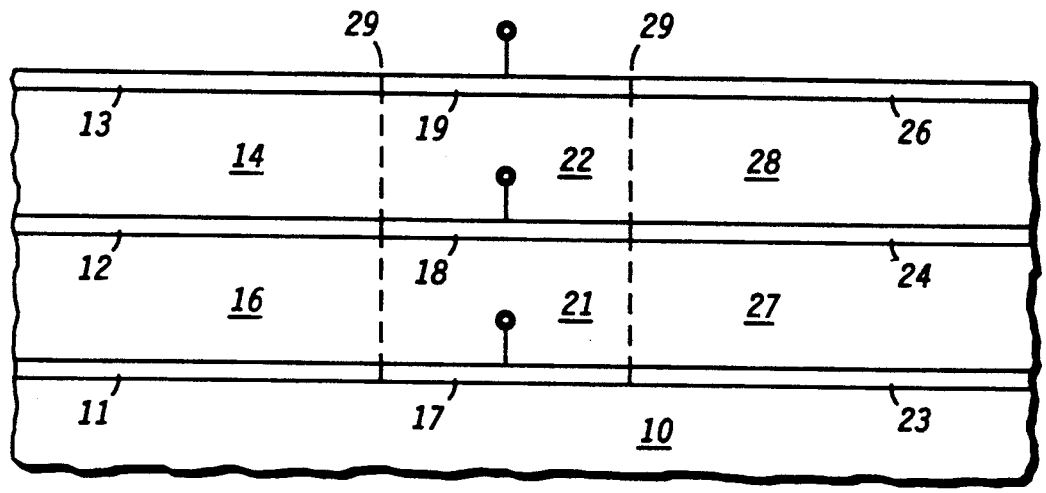
FIG. 1
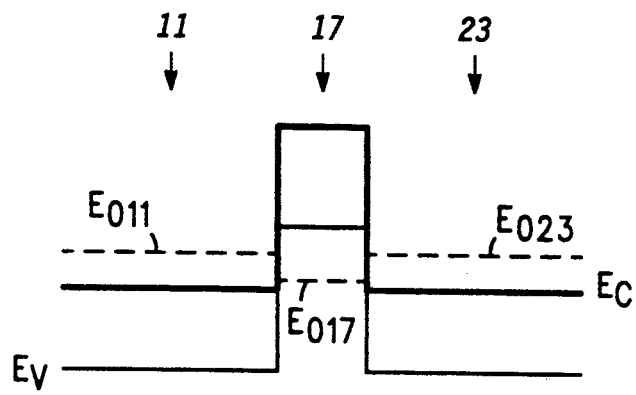
FIG. 2
FIG. 3
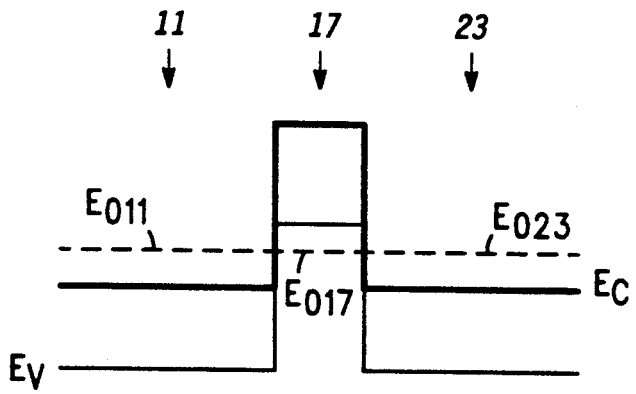

INTERCONNECT STRUCTURE FOR COUPLING SEMICONDUCTOR REGIONS AND METHOD FOR MAKING

BACKGROUND OF THE INVENTION

The present invention relates, in general, to interconnect structures for semiconductor devices and, more particularly, to quantum well interconnect structures for semiconductor devices.

As semiconductor device dimensions approach the sub-micron level, one of the limiting factors for further reduction in size is area required for device interconnections. One possible solution is multilevel metallization in which two or more interconnect layers are formed on top of a device, separated by an inter-layer dielectric, and coupled by holes, or vias, which are filled with a via metallization. Even with multilayer metallization, though, the area required for vias limits further reduction in device size.

Small metal vias also result in current crowding and less reliable operation due to electromigration effects. Current crowding occurs at metal corners at the interface between the interconnect layer and the via metallization, resulting in higher current density at the corners than in the body of the via metallization. Current crowding effects significantly reduced the lifetime and reliability of the via metallization. These reliability problems are complicated in modern devices which require millions of metal interconnections.

Another problem with previous multilayer metallization processes was filling the via with the via metallization without creating voids so that a high quality electrical contact was formed. Conventional metal deposition methods such as evaporation, sputtering, and reactive ion sputtering have been used to fill vias. These metal deposition methods result in poor step coverage in small vias, which is aggravated as the aspect ratio, that is the ratio of height to width of the via, increased. Poor step coverage forces manufacturers to slope the via walls to step coverage and decrease the aspect ratio, but also increased the dimensions of the contact. What is needed is a truly compact, reliable interconnect method and structure that does not use conventional metal materials and processes.

SUMMARY OF THE INVENTION

Briefly stated, the advantages of the present invention are achieved by a semiconductor device having a lateral interconnect formed by a quantum well comprising a first semiconductor material composition. A first semiconductor region comprising a second material type is formed adjacent to the lateral interconnect. A second semiconductor region comprising the second material type is adjacent to the lateral interconnect so that the lateral interconnect separates the first and second semiconductor regions. The first and second semiconductor regions have a first quantized energy level that is substantially equal. The lateral interconnect has a first quantized energy level capable of alignment with the quantized energy levels of the first and second semiconductor regions.

BRIEF DESCRIPTION OF THE DRAWINGS

FIG. 1 illustrates a cross sectional view of a semiconductor device having a vertical quantum well via in accordance with the present invention;

FIG. 2 illustrates a band diagram of a first portion of the structure shown in FIG. 1 with no applied bias;

FIG. 3 illustrates a band diagram of a first portion of the structure shown in FIG. 1 with applied bias;

DETAILED DESCRIPTION OF THE DRAWINGS

Figure 4:
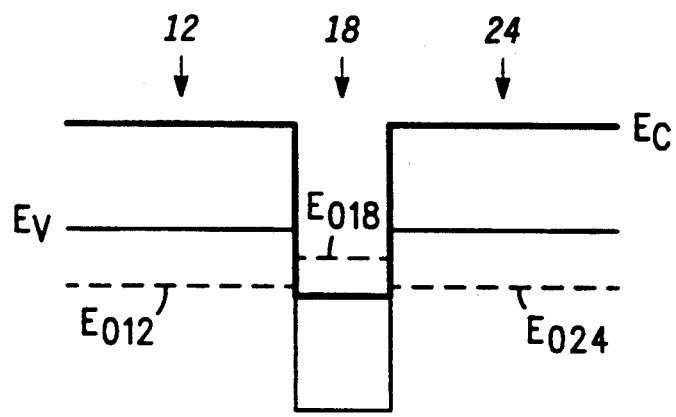
FIG. 4 illustrates a band diagram of a second portion of the structure shown in FIG. 1 with no applied bias.

Conventional metal interconnect technology requires that metal layers be deposited at a late stage of processing to prevent damage to the metal layer during high temperature processing usually associated with semiconductor manufacturing. Because of this, all of the device interconnections must be made at the upper surface of the device and each electrode of each device must couple to one or more metal interconnect networks formed on the surface. In accordance with the present invention, a densely populated integrated circuit is provided by interconnecting buried semiconductor regions thus allowing more complex interconnection than allowed by conventional metal interconnect technology.

Common semiconductor devices useful in the practice of the present invention include metal oxide semiconductor and bipolar transistors, resistors, capacitors, and the like. The cross-sectional view shown in FIG. 1 illustrates a simple device structure having semiconductor device regions 11, 12, 13, 23, 24, and 26. Any type of semiconductor device (not shown) can be fabricated in these device regions using techniques and processes widely available in the art, including resistors, capacitors, field effect transistors, as well as bipolar and heterojunction transistors. A purpose of the structure in accordance with the present invention is to provide controllable interconnection of semiconductor devices formed in horizontally adjacent active regions such as 11 and 23, 12 and 24, as well as 13 and 26.

Active semiconductor regions 11–13 and 23–26 are formed on a crystal substrate 10 which comprises, for example, semi-insulating gallium arsenide (GaAs). It should be understood that the upper surface of substrate 10 usually includes an epitaxially grown buffer layer to improve crystal perfection and compatibility with subsequent epitaxial processing. For ease of illustration and understanding, however, a buffer layer is not separately shown in FIG. 1. Accordingly, substrate 10 is intended to include all suitable buffer layers or buried layers required by a particular application.

The structure shown in FIG. 1 is provided by forming a layer of a first material composition on the upper surface of substrate 10. In a preferred embodiment, the first semiconductor layer comprises gallium antimonide (GaSb) or indium arsenide (InAs) and is in the range of five to twenty-five nanometers thick. This first semiconductor layer is eventually patterned to provide a first active device region 11 and a second active device region 23, but greater utility is achieved if a plurality of active device layers are formed in a vertical stack, as shown in FIG. 1, then patterned and etched together.

A first barrier layer comprising a wide bandgap material is formed covering the patterned first semiconductor layer. The first barrier layer is eventually patterned to define barrier region 16 covering active device region 11 and barrier region 27 covering active device region 23. All of the barrier regions shown in FIG. 1 are substantially the same, and comprise a material such as aluminum antimonide (AlSb) or aluminum gallium antimonide (AlGaSb) and are at least ten nanometers thick.

For ease of illustration, regions of a first material composition are darkly shaded, regions of a second material composition are lightly shaded, and regions of barrier material are not shaded. The second material composition preferably comprises gallium antimonide or indium arsenide, but should be different from the first material composition. In other words, if GaSb is used for the first material composition, InAs should be used for the second material composition. Likewise, if the first material composition is InAs, the second material composition should be GaSb. As used herein, the term "material composition" means the constituent elements of a crystalline material, and is not intended to mean regions that comprise one material but are doped to different conductivity types.

The first barrier layer is covered by a second semiconductor layer comprising gallium antimonide (GaSb) or indium arsenide (InAs) and is in the range of five to twenty-five nanometers thick. Although the second semiconductor layer is illustrated as comprising the second material composition, it should be understood that the second semiconductor layer may or may not be the same material composition as the first semiconductor layer.

This second semiconductor layer is eventually patterned to provide semiconductor device regions 12 and 24. Like the first semiconductor layer, a wide variety of semiconductor devices can be formed in both device region 12 and device region 24, including resistors, capacitors, FETs as well as bipolar and heterojunction transistors.

A large number of semiconductor layers can be similarly formed and vertically stacked in independent horizontal planes separated from vertically adjacent semiconductor layers by wide bandgap layers. One such additional layer is illustrated in FIG. 1 as semiconductor device regions 13 and 26 separated from device regions 12 and 24 by wide bandgap barrier regions 14 and 28, respectively.

Quantum well interconnects 17, 18 and 19 that couple horizontally adjacent semiconductor regions are an important feature of the present invention. As shown in FIG. 1, each quantum well interconnect lies in the same horizontal plane as a pair of semiconductor device regions, but each comprises a layer of semiconductor material that is different in composition from the particular semiconductor device regions that it couples. For example, quantum well interconnect 17 comprises the second material type where semiconductor regions 11 and 23 comprise the first material type. Similarly, quantum well interconnect 18 comprises the first material type where semiconductor regions 12 and 24 comprise the second material type.

Quantum well interconnects 17, 18 and 19 are preferably formed by etching a trench through the third, second and first semiconductor layers and the layers of barrier material that separate them. Dashed lines 29 suggest the location of this trench. This etch step forms electrically separate device regions such as 11, 12, 13, 23, 24 and 26. The etch step can be deep enough to expose a portion of crystalline substrate 10, as illustrated in FIG. 1, but may be shallower when specific applications do not require lateral interconnection of underlying layers. Quantum well interconnect 17 is formed by epitaxial deposition of the second material type in a layer that covers the exposed portion of substrate 10. Quantum well interconnect 17 is subsequently covered by a layer of wide bandgap material to form barrier region 21.

Quantum well interconnects 18 and 19 are formed in a similar manner, making sure that each interconnect comprises a material of the opposite composition from that of the semiconductor device regions formed in the same horizontal plane as the interconnect. Electrodes are formed and coupled to each quantum well interconnect for coupling the interconnect to a bias voltage (not shown).

Each of the quantum well interconnects 17, 18 and 19 function in a similar manner. Operation is described with reference to FIG. 2 and FIG. 3 which illustrate band diagrams describing semiconductor regions 11 and 23 with quantum well interconnect 17. Operation is further described in reference to FIG. 4 and FIG. 5 which illustrate band diagrams describing semiconductor regions 12 and 24 with quantum well interconnect 18. It should be understood that semiconductor devices (not shown) in each of the active device regions conduct current essentially horizontally, and each interconnect serves to controllably conduct current from one active device region to a horizontally adjacent active device region.

In FIG. 2–FIG. 5 the vertical axis represents relative band energy and the horizontal axis represents location within a particular horizontal plane of the structure shown in FIG. 1. Also, the first material type, illustrated by dark shaded regions in FIG. 1, is InAs, while the second material type, illustrated by lightly shaded region, is GaSb.

In each of semiconductor device regions 11 and 23 quantized energy states exist, indicated by dashed lines $E_{011}$ and $E_{023}$ respectively. The energy levels are determined by thickness of device regions 11 and 23, as well as material composition as is well known in the semiconductor arts. Similarly, a quantized energy state $E_{017}$ exists in quantum well interconnect 17. Because quantum well interconnect 17 comprises a different material than device regions 11 and 23, the dimensions of the layers can be chosen so that $E_{017}$ is not aligned with $E_{011}$ or $E_{023}$ under zero bias as illustrated in FIG. 2. Because of this misalignment, current cannot flow from device region 11 to device region 23, and the regions are effectively decoupled.

FIG. 3 illustrates the band relationships when a predetermined bias is applied to quantum well interconnect 17 sufficient to align $E_{017}$ with $E_{011}$ and $E_{023}$. Under this bias, current can flow from device region 11, through the $E_{017}$ energy state to device region 23, and the interconnect is effectively turned on.

Figure 5:
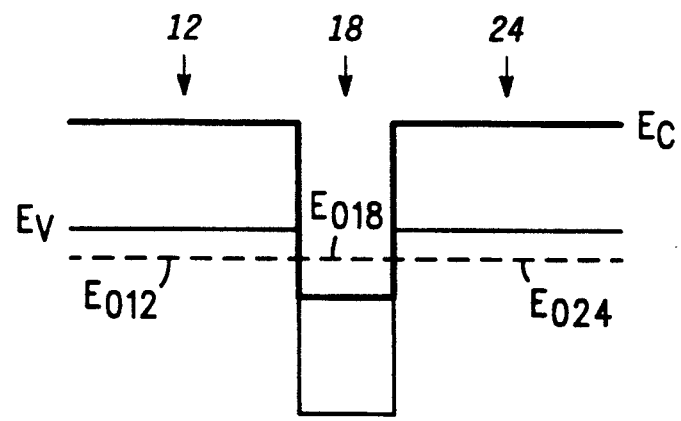
FIG. 5 illustrates a band diagram of a second portion of the structure shown in FIG. 1 with applied bias.

FIG. 4 illustrates unbiased operation for semiconductor device regions 12 and 24 which comprise GaSb with quantum well interconnect 18 which comprises InAs. In this case, the zero bias condition results in misalignment between $E_{018}$ and $E_{012}$ and $E_{024}$ preventing current flow between semiconductor device regions 12 and 24. As illustrated in FIG. 5, application of a predetermined bias voltage to quantum well interconnect 18 results in energy state alignment, and electrical coupling between semiconductor device regions 12 and 24.

By now it should be appreciated that a semiconductor device having lateral interconnections using semiconductor quantum wells is provided. Using semiconductor materials for interconnections greatly reduces the number of metal interconnections required for complex integrated circuits, thus improving reliability. Moreover, the quantum well vias in accordance with the present invention allow truly three dimensional device arrangement, improving packing density and functionality of integrated circuits.

We claim:

1. An interconnect structure for coupling semiconductor regions comprising:
   a substrate having an upper surface;
   a first active device region formed on the upper surface in a first horizontal plane parallel to the upper surface, wherein the first active device region comprises a first metal composition having a quantized energy level $E_{011}$;
   a second active device region formed on the upper surface in the first horizontal plane, wherein the second active device region comprises the first metal composition and has a quantized energy level $E_{023}$ substantially equal to $E_{011}$; and
   a quantum well interconnect electrically coupling the first active device region to the second active device region, wherein the quantum well interconnect comprises a second material composition having a quantized energy level $E_{017}$ capable of alignment with the $E_{011}$ and $E_{023}$, and wherein the quantum well interconnect has an electrode for electrically coupling to an external bias voltage.

2. The interconnect structure for coupling semiconductor regions of claim 1 further comprising:
   a first barrier region comprising a wide bandgap material covering the first active device region;
   a second barrier region comprising the wide bandgap material covering the second active device region;
   a third barrier region comprising the wide bandgap material covering the quantum well interconnect;
   a third active device region covering the first barrier region, wherein the third active device region comprises the second material composition;
   a fourth active device region covering the second barrier region, wherein the fourth active device region comprises the second material composition; and
   a second quantum well interconnect covering the third barrier region and electrically coupling to the third and fourth active device regions, wherein the second quantum well interconnect has a quantized energy level $E_{018}$ capable of alignment with quantized energy levels of the third and fourth active device regions.

3. The interconnect structure for coupling semiconductor regions of claim 1 wherein the first and second active device regions comprise indium arsenide, and the quantum well interconnect comprises gallium antimonide.

4. The interconnect structure for coupling semiconductor regions of claim 1 wherein the first and second active device regions comprise gallium antimonide, and the quantum well interconnect comprises indium antimonide.

5. The interconnect structure for coupling semiconductor regions of claim 2 wherein the barrier material comprises aluminum antimonide.

6. The interconnect structure for coupling semiconductor regions of claim 2 wherein the barrier material comprises aluminum gallium antimonide.

7. An interconnect structure for coupling semiconductor regions comprising:
   a crystal substrate having an upper surface;
   a plurality of active semiconductor layers formed on the upper surface of the crystal substrate, each active semiconductor layer comprising a first and a second active device region having a quantized energy level $E_a$, and a quantum well interconnect electrically coupling each of the first and second active device regions and having a quantized energy level $E_b$, wherein $E_b$ can be aligned to $E_a$ by application of a bias potential to the quantum well interconnect; and
   a plurality of barrier regions comprising wide bandgap material formed between and isolating each of the active semiconductor layers from each other.

8. The interconnect structure for coupling semiconductor regions of claim 7 wherein each of the quantum well interconnects further comprises an electrode for coupling to an external bias voltage supply.

* * * * *

UNITED STATES PATENT AND TRADEMARK OFFICE
CERTIFICATE OF CORRECTION

PATENT NO. : 5,280,180

DATED : January 18, 1994

INVENTOR(S) : Herbert Goronkin et al.

It is certified that error appears in the above-identified patent and that said Letters Patent is hereby corrected as shown below:

Column 5, claim 1, line 14, change "metal" to --material--.

Column 5, claim 1, line 19, change "metal" to --material--.

Signed and Sealed this

Twenty-sixth Day of July, 1994

Attest:

BRUCE LEHMAN

Attesting Officer

Commissioner of Patents and Trademarks